(12) United States Patent
Sato et al.

(10) Patent No.: US 8,349,725 B2
(45) Date of Patent: Jan. 8, 2013

(54) METHOD OF MANUFACTURING SEMICONDUCTOR DEVICE, SEMICONDUCTOR MANUFACTURING APPARATUS, AND STORAGE MEDIUM

(75) Inventors: Hiroshi Sato, Nirasaki (JP); Hitoshi Itoh, Nirasaki (JP); Kenji Matsumoto, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 54 days.

(21) Appl. No.: 12/920,701

(22) PCT Filed: Feb. 20, 2009

(86) PCT No.: PCT/JP2009/053032
§ 371 (c)(1),
(2), (4) Date: Jun. 9, 2011

(87) PCT Pub. No.: WO2009/110330
PCT Pub. Date: Sep. 11, 2009

(65) Prior Publication Data
US 2011/0237066 A1    Sep. 29, 2011

(30) Foreign Application Priority Data

Mar. 3, 2008   (JP) ................ 2008-052411

(51) Int. Cl.
*H01L 21/4763* (2006.01)
(52) U.S. Cl. ........ 438/627; 438/624; 438/628; 438/635; 438/637; 438/644; 438/653; 438/654; 427/255.14; 427/357; 257/751; 257/E21.577; 156/345.18; 156/345.24; 118/50; 118/723 VE
(58) Field of Classification Search .................. None
See application file for complete search history.

(56) References Cited

U.S. PATENT DOCUMENTS

| 2002/0009872 A1 | 1/2002 | Hoshino et al. |
| 2003/0136423 A1 | 7/2003 | Akbar et al. |
| 2005/0218519 A1 | 10/2005 | Koike et al. |
| 2007/0173055 A1 | 7/2007 | Ohtsuka et al. |
| 2009/0246957 A1* | 10/2009 | Kamimura ............. 438/693 |
| 2010/0140802 A1* | 6/2010 | Matsumoto et al. ...... 257/741 |

FOREIGN PATENT DOCUMENTS

JP    2001-298028    10/2001
(Continued)

OTHER PUBLICATIONS

International Search Report mailed on May 19, 2009 for application No. PCT/JP2009/053032.

*Primary Examiner* — Julio J Maldonado
*Assistant Examiner* — Yasser Abdelaziez
(74) *Attorney, Agent, or Firm* — Smith, Gambrell & Russell, LLP

(57) ABSTRACT

The present invention is a method of manufacturing a semiconductor device comprising: forming a recess in an interlayer insulating film formed on a substrate surface, the recess being configured to be embedded with an upper conductive channel mainly made of copper to be electrically connected to a lower conductive channel; supplying a gas containing an organic compound of manganese, and forming a barrier layer made of a compound of manganese for preventing diffusion of copper to the interlayer insulating film, such that the barrier layer covers an exposed surface of the interlayer insulating film; after the formation of the barrier layer, supplying organic acid to the barrier layer in order to increase a ratio of manganese in the compound of manganese forming the barrier layer; after the supply of the organic acid, forming a seed layer mainly made of copper on a surface of the barrier layer; after the formation of the seed-layer, heating the substrate in order to separate out manganese from on the surface of the barrier layer or from in the barrier layer onto a surface of the seed layer; supplying a cleaning liquid to the seed layer in order to remove the manganese separated out on the surface of the seed layer by the heating; and after the supply of the cleaning liquid, forming the upper conductive channel mainly made of copper in the recess.

15 Claims, 12 Drawing Sheets

FOREIGN PATENT DOCUMENTS

| JP | 2003-218198 | 7/2003 |
| JP | 2005-277390 | 10/2005 |
| JP | 2006/156486 | 6/2006 |
| JP | 2007-109687 | 4/2007 |
| JP | 2007-221103 | 8/2007 |
| JP | 2008-13848 | 1/2008 |

\* cited by examiner

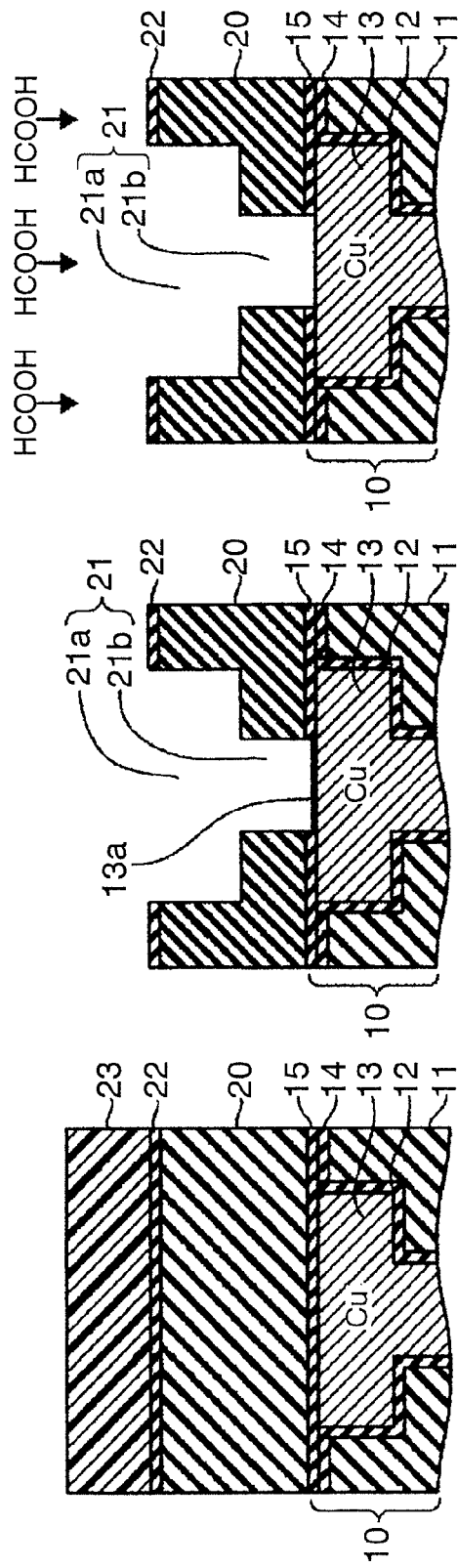

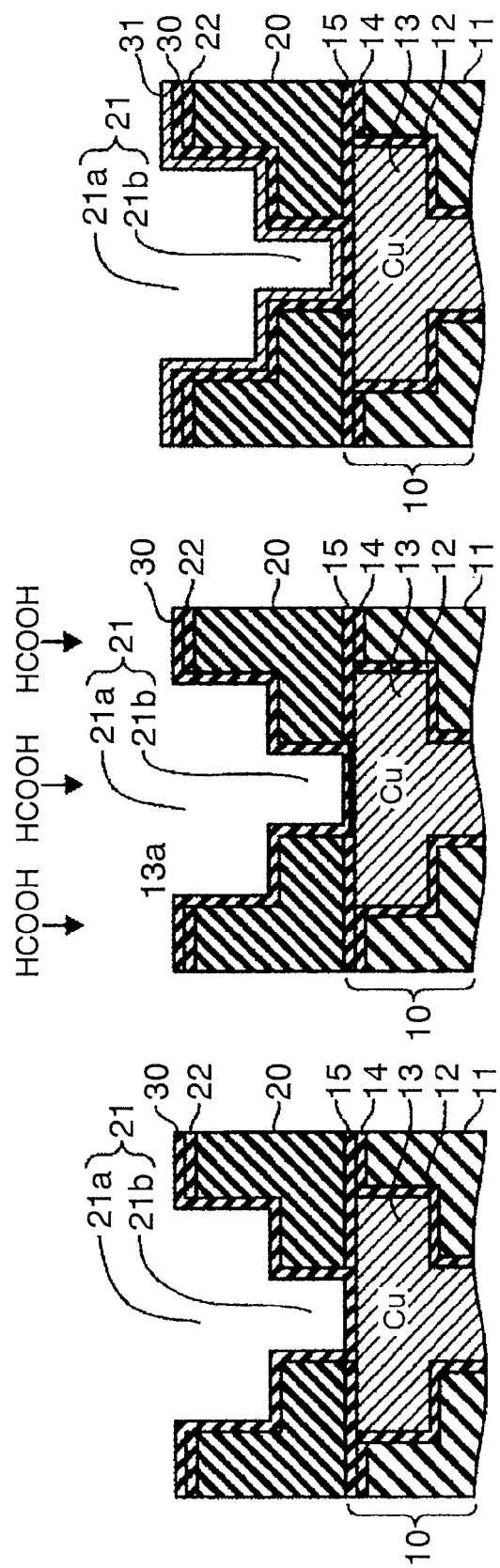

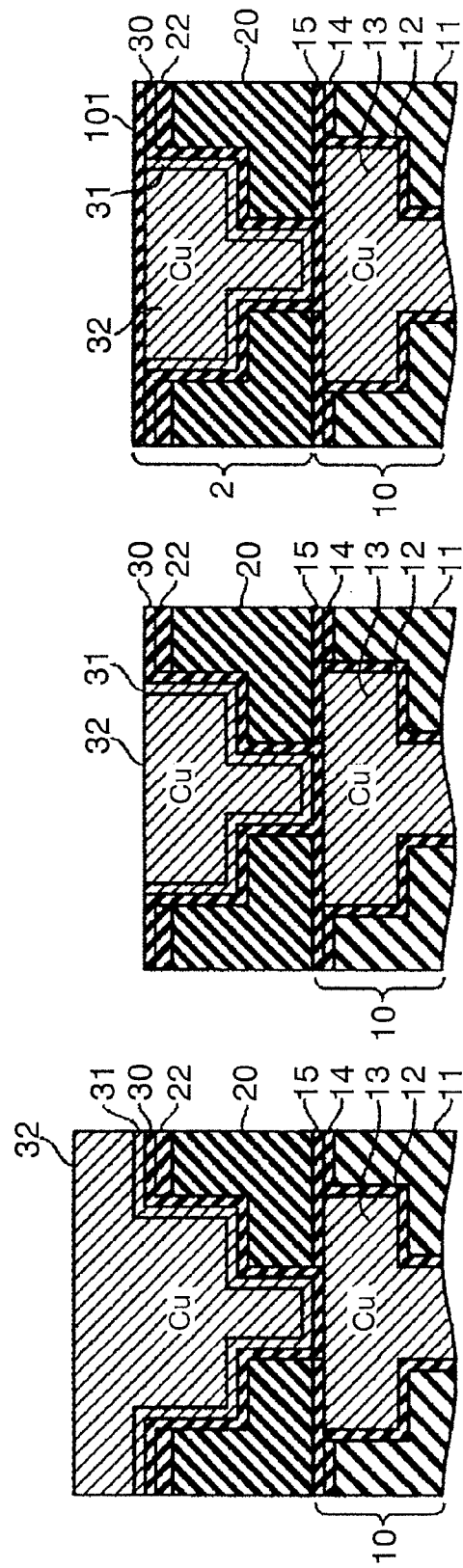

METHOD OF MANUFACTURING SEMICONDUCTOR DEVICE, SEMICONDUCTOR MANUFACTURING APPARATUS, AND STORAGE MEDIUM

FIELD OF THE INVENTION

The present invention relates to: a method of manufacturing a semiconductor device for forming a barrier layer on an inside surface of a recess formed in an interlayer insulating film and for forming a conductive channel mainly made of copper from above the barrier layer; a semiconductor manufacturing apparatus; and a storage medium.

BACKGROUND ART

A multilayer wiring structure of a semiconductor device is formed by embedding a metal wiring in an interlayer insulating film. As a material of the metal wiring, copper (Cu) is used because of its small electro-migration and its small low resistance. A damascene method is generally used for forming the multilayer wiring structure. In particular, a dual damascene method is an advantageous method having lesser steps. In the dual damascene method, Cu is simultaneously embedded into a connection hole and a wiring groove which have been previously formed in an interlayer insulating film.

In the dual damascene method, a trench in which a wiring is arranged in a layer, and a via hole for connecting an upper wiring and a lower wiring, are formed in an interlayer insulating film of a substrate. Then, Cu is embedded into these recesses by a CVD method or an electroplating method. Before each of these recesses is embedded with copper, a Cu seed layer serving as an electrode may be formed along an inside surface of the recess, in order for a suitable embedment of Cu. In addition, since Cu tends to diffuse in the interlayer insulating film, it is necessary to form a barrier layer, which is formed of e.g., a Ta/TaN laminate body, in the recess. Thus, a barrier layer is sometimes formed on the surface of the interlayer insulating film and the inside surface of each recess by a sputtering method, for example, and a Cu seed layer is further formed thereon.

In recent years, as a method for forming a barrier layer, the following method has been regarded as favorable (for example, JP2007-221103A). Namely, a seed layer made of CuMn alloy is formed by sputtering on a recess formed in an interlayer insulating film formed of a $SiO_2$ film or a SiOCH film that is a low dielectric constant film. Then, Mn atoms in the CuMn alloy and oxygen (O) atoms in the interlayer insulating film are reacted with each other, so that a barrier layer made of manganese oxide is self-formed on the surface of the interlayer insulating film.

As compared with the method of forming a barrier layer of a Ta/TaN laminate body, the above method is advantageous in that a barrier layer sandwiched between the interlayer insulating film and a Cu wiring can be made thinner. However, in the method of forming a CuMn-alloy seed layer by a sputtering method, an inside surface of a small recess cannot be well coated, so that the inside surface cannot be well coated with Mn. Thus, Cu diffuses in the interlayer insulating film, which impairs an insulation property of the interlayer insulating film.

Thus, in order to improve a coating property of a barrier layer in the recess, the present inventors have developed a method of forming a barrier layer in which a gas containing an organic compound of manganese is supplied, so as to directly form a barrier layer made of the manganese compound inside the recess formed in an interlayer insulating film. To be specific, a steam of an organic compound of manganese is reacted with oxygen, carbon, or silicon, which is one of the components contained in the interlayer insulating film, so as to form a barrier layer made of the manganese compound inside the recess. Alternatively, a steam of an organic compound of manganese is reacted with an oxygen gas, so as to form a barrier layer made of manganese oxide. However, these methods have the following problems. Namely, after a barrier layer has been formed by these methods, and a Cu seed layer has been formed thereon, a Cu wiring is formed in the recess. In this case, since the barrier layer and the Cu wiring with the Cu seed layer therebetween do not well adhere to each other, the Cu wiring formed in the recess may peel therefrom. Thus, the wiring may be damaged to invite breaking of the wire. In addition, also in a case where the Cu wiring is directly formed on the barrier layer, since the barrier layer does not well adhere to the Cu wiring, the same problem may arise.

In addition, there is another problem. Namely, when a barrier layer is formed, excessive manganese, which did not react with the part of the components contained in the interlayer insulating film or the oxygen gas, may be drawn (taken) into the surface of the barrier layer or into the barrier layer, so that the excessive manganese may diffuse in the Cu wiring. In this case, since electric conductivity of Mn is significantly lower than that of Cu, electric resistance of the Cu wiring may undesirably increase.

SUMMARY OF THE INVENTION

The present invention has been made in view of the above circumstances. The object of the present invention is, when a barrier layer made of a manganese compound is formed on an inside surface of a recess formed in an interlayer insulating film, and a conductive channel mainly made of copper is formed from above the barrier layer, to provide a technique for improving the contact (adherence) between the barrier layer and the conductive channel, and for inhibiting the increase of electric resistance of the conductive channel.

The method of manufacturing a semiconductor device according to the present invention is a method of manufacturing a semiconductor device comprising: forming a recess in an interlayer insulating film formed on a substrate surface, the recess being configured to be embedded with an upper conductive channel mainly made of copper to be electrically connected to a lower conductive channel; supplying a gas containing an organic compound of manganese, and forming a barrier layer made of a compound of manganese for preventing diffusion of copper to the interlayer insulating film, such that the barrier layer covers an exposed surface of the interlayer insulating film; after the formation of the barrier layer, supplying organic acid to the barrier layer in order to increase a ratio of manganese in the compound of manganese forming the barrier layer; after the supply of the organic acid, forming a seed layer mainly made of copper on a surface of the barrier layer; after the formation of the seed-layer, heating the substrate in order to separate out manganese from on the surface of the barrier layer or from in the barrier layer onto a surface of the seed layer; supplying a cleaning liquid to the seed layer in order to remove the manganese separated out on the surface of the seed layer by the heating; and after the supply of the cleaning liquid, forming the upper conductive channel mainly made of copper in the recess.

In addition, the method of manufacturing a semiconductor device according to the present invention is a method of manufacturing a semiconductor device comprising: forming a recess in an interlayer insulating film formed on a substrate surface, the recess being configured to be embedded with an upper conductive channel mainly made of copper to be electrically connected to a lower conductive channel; supplying a gas containing an organic compound of manganese, and forming a barrier layer made of a compound of manganese for preventing diffusion of copper to the interlayer insulating film, such that the barrier layer covers an exposed surface of the interlayer insulating film; after the formation of the barrier layer, supplying organic acid to the barrier layer in order to increase a ratio of manganese in the compound of manganese forming the barrier layer; after the supply of the organic acid, forming the upper conductive channel mainly made of copper in the recess; after the formation of the upper conductive channel, heating the substrate in order to separate out manganese from on the surface of the barrier layer or from in the barrier layer onto a surface of the upper conductive channel layer; and after the heating of the substrate, removing the manganese separated out on the surface of the upper conductive channel.

The aforementioned method of manufacturing a semiconductor device may further comprise after the removal of the manganese separated out on the upper conductive channel, reacting a steam of an organic compound of manganese and a gas containing oxygen for forming an oxide of manganese with each other, and forming a barrier layer made of the oxide of manganese on the upper conductive channel, or may further comprise before the formation of the barrier layer, removing an oxide of copper on the surface of the lower conductive channel, the surface being exposed to a bottom part of the recess.

It is preferable that the removal of the oxide is to supply organic acid to the recess. As the organic acid, carboxylic acid is preferred, for example. As the compound of manganese for preventing diffusion of copper to the interlayer insulating film, an oxide of manganese may be taken by way of example.

In addition, the present invention is a semiconductor manufacturing apparatus configured to form an upper conductive channel in a recess formed in an interlayer insulating film on a substrate surface, with a lower conductive channel mainly made of copper being exposed to a bottom part of the recess, the semiconductor manufacturing apparatus comprising: a vacuum transfer chamber module including a vacuum-atmosphere transfer chamber into which a substrate is loaded, and a substrate transfer unit disposed in the transfer chamber; a barrier-layer forming module including: a processing vessel in which a substrate can be placed, the processing vessel being hermetically connected to the vacuum transfer chamber module; and a unit configured to supply a gas containing an organic compound of manganese, and to form a barrier layer made of a compound of manganese for preventing diffusion of copper to the interlayer insulating film, such that the barrier layer covers an exposed surface of the interlayer insulating film; an organic-acid supplying module including: a processing vessel in which a substrate can be placed, the processing vessel being hermetically connected to the vacuum transfer chamber module; and a unit configured to supply organic acid to the barrier layer in order to increase a ratio of manganese in the compound of manganese forming the barrier layer; a seed-layer forming module including: a processing vessel in which a substrate can be placed, the processing vessel being hermetically connected to the vacuum transfer chamber module; and a unit configured to form a seed layer mainly made of copper on a surface of the barrier layer; a heating module including: a processing vessel in which a substrate can be placed, the processing vessel being hermetically connected to the vacuum transfer chamber module; and a unit configured to heat the substrate in order to separate out manganese from on the surface of the barrier layer or from in the barrier layer onto a surface of the seed layer; a cleaning-liquid supplying module including: a processing vessel in which a substrate can be placed, the processing vessel being hermetically connected to the vacuum transfer chamber module; and a unit configured to supply a cleaning liquid to the seed layer in order to remove the manganese separated out on the surface of the seed layer by the heating; and a conductive-channel forming module including: a processing vessel in which a substrate can be placed, the processing vessel being hermetically connected to the vacuum transfer chamber module; and a unit configured to form the upper conductive channel mainly made of copper in the recess; wherein there is provided a control unit configured to control the substrate transfer unit such that a substrate loaded into the vacuum transfer chamber module is transferred to the barrier-layer forming module, the organic-acid supplying module, the seed-layer forming module, the heating module, the cleaning-liquid supplying module, and the conductive-channel forming module in this order.

Further, the present invention is a semiconductor manufacturing apparatus configured to form an upper conductive channel in a recess formed in an interlayer insulating film on a substrate surface, with a lower conductive channel mainly made of copper being exposed to a bottom part of the recess, the semiconductor manufacturing apparatus comprising: a vacuum transfer chamber module including a vacuum atmosphere transfer chamber to which a substrate is loaded, and a substrate transfer unit disposed in the transfer chamber; a barrier-layer forming module including: a processing vessel in which a substrate can be placed, the processing vessel being hermetically connected to the vacuum transfer chamber module; and a unit configured to supply a gas containing an organic compound of manganese, and to form a barrier layer made of a compound of manganese for preventing diffusion of copper to the interlayer insulating film, such that the barrier layer covers an exposed surface of the interlayer insulating film; an organic-acid supplying module including: a processing vessel in which a substrate can be placed, the processing vessel being hermetically connected to the vacuum transfer chamber module; and a unit configured to supply organic acid to the barrier layer in order to increase a ratio of manganese in the compound of manganese forming the barrier layer; a conductive-channel forming module including: a processing vessel in which a substrate can be placed, the processing vessel being hermetically connected to the vacuum transfer chamber module; and a unit configured to form the upper conductive channel mainly made of copper in the recess; and a heating module including: a processing vessel in which a substrate can be placed, the processing vessel being hermetically connected to the vacuum transfer chamber module; and a unit configured to heat the substrate in order to separate out manganese from on the surface of the barrier layer or from in the barrier layer onto a surface of the upper conductive channel; wherein there is provided a control unit configured to control the substrate transfer unit such that a substrate loaded into the vacuum transfer chamber module is transferred to the barrier-layer forming module, the organic-acid supplying module, the conductive-channel forming module, and the heating module, in this order.

The aforementioned semiconductor manufacturing apparatus may further comprise a copper-oxide removing module including: a processing vessel in which a substrate can be placed, the processing vessel being hermetically connected to the vacuum transfer chamber module; and a unit configured to remove an oxide of copper on the surface of the lower conductive channel, the surface being exposed to the bottom part of the recess, wherein the control unit is configured to control the substrate transfer unit such that the substrate loaded into the vacuum transfer chamber module is loaded into the copper-oxide removing module, and then transferred to the barrier-layer forming module.

It is preferable that the unit configured to remove an oxide of copper is a unit configured to supply organic acid to the substrate. As the organic acid, carboxylic acid is preferred, for example. As the compound of manganese for preventing diffusion of copper to the interlayer insulating film, an oxide of manganese may be taken by way of example.

In addition, the present invention is a storage medium used in a semiconductor manufacturing apparatus configured to process a substrate, the storage medium storing a computer program operatable on a computer, wherein the computer program has a group of steps for realizing the aforementioned method of manufacturing a semiconductor device.

According to the present invention, after the barrier layer made of the oxide of manganese has been formed, the organic acid is supplied to the wafer so as to reduce a part of the oxide of manganese forming the barrier layer. Thus, the stoichiometric imbalance is generated in the composition ratio in the oxide of manganese, so that a ratio of manganese in the oxide of manganese is increased. Therefore, the barrier layer and the copper wiring can closely adhere to each other, with the copper seed layer therebetween. For this reason, there is no possibility that the copper wiring peels and becomes defective.

In addition, the supply of the organic acid increases the manganese concentration. Further, there remains the excessive manganese which did not react with the oxygen gas when the barrier layer was formed. Thus, the manganese concentration on the surface of the barrier layer and/or in the barrier layer is increased. However, since the manganese on the surface of the barrier layer and/or the manganese in the barrier layer are removed in the following manner, there is no possibility that the electric resistance of the copper wiring is increased. Namely, after the formation of the copper seed layer, the manganese on the surface of the barrier layer and/or the manganese in the barrier layer are separated out on the surface of the seed layer by a heating process. Then, the separated-out manganese is removed by the cleaning process before the formation of the copper wiring in the recess.

BRIEF DESCRIPTION OF THE DRAWINGS

FIG. 1 includes views showing a manufacturing procedure of a semiconductor device according to the present invention;

FIG. 2 includes views showing the manufacturing procedure of the semiconductor device according to the present invention;

FIG. 4 includes vies showing the manufacturing procedure of the semiconductor device according to the present invention;

DETAILED DESCRIPTION OF THE INVENTION

First Embodiment

Figures 3A, 3B, 3C:
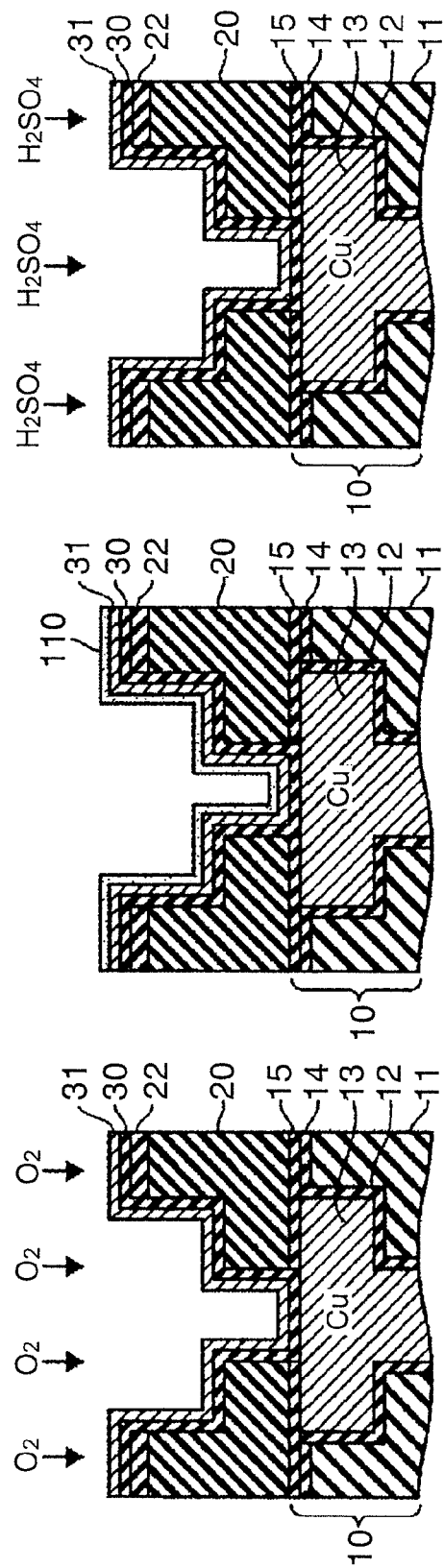
FIG. 3 includes views showing the manufacturing procedure of the semiconductor device according to the present invention.

An embodiment of a method of manufacturing a semiconductor device according to the present invention is described with reference to FIGS. 1 to 4.

FIG. 1(a) shows a circuit layer 10 on a lower side (lower circuit layer 10) which is formed on a semiconductor wafer (hereinafter referred to as "wafer") as a substrate. The circuit layer 10 is formed by embedding a copper wiring 13 in an interlayer insulating film 11 through a barrier layer 12. The interlayer insulating film 11 is formed of a SiCOH film that is a low dielectric constant film. The copper wiring 13 is mainly made of copper, and serves as a conductive channel in a lower layer (lower conductive channel). The reference number 14 in FIG. 1 depicts a hard mask formed of a SiCN film, which is used when a recess is formed in the interlayer insulating film 11. Laminated on the interlayer insulating film 11 is an interlayer insulating film 20 formed of a SiCOH film, through an etching stop layer 15 made of SiC or SiCN, for example. The etching stop layer 15 functions as a barrier layer on an upper surface of a trench portion of the copper wiring 13 in the lower layer (lower copper wiring 13). On the interlayer insulating film 20, there are laminated a hard mask 22 formed of a SiCN film for forming a recess 21, which will be described below, in the interlayer insulating film 20, and a sacrifice layer 23 formed of, e.g., an organic photoresist mask, in this order. A copper wiring 32, which serves as a conductive channel in an upper layer (upper conductive channel) and is mainly made of copper, is formed in the wafer in the following manner.

As shown in FIG. 1(b), by using the hard mask 22 and the sacrifice layer 23, the recess 21 is formed by etching. The recess 21 includes a trench 21a having a width of, e.g., 70 nm, and a via hole 21b having a diameter of, e.g., 50 nm. The etching process is carried out by making plasma a process gas such as a CF-series gas and an $O_2$ gas. Due to the etching process, a surface of the copper wiring 13 in the lower circuit layer 10 is exposed. Then, the sacrifice layer 23 is removed by an ashing process that supplies an $O_2$-gas plasma to the wafer. Since the gas used in the plasma processes includes an $O_2$ gas, when the plasma of the etching gas comes into contact with the exposed surface of the copper wiring 13, the exposed surface is oxidized to generate a copper oxide 13a. Thereafter, in order to remove residues adhering to the inside of the recess 21 by the above etching process and the ashing process, a dry cleaning process using an argon (Ar) gas plasma, for example, is performed. In addition, since the residues adhere to a side surface and/or a rear surface of the wafer as well, the wafer is unloaded from an etching apparatus to an atmosphere of air, for example. Then, the wafer is immersed into, e.g., a hydrofluoric acid (HF) solution so as to be wet-cleaned. At this time, since the wafer is transferred in the atmosphere of air, the surface of the copper wiring 13 is further oxidized.

Thereafter, the wafer is loaded into a vacuum processing apparatus. Then, as shown in FIG. 1(c), a mixed gas of a steam of carboxylic acid, which is organic acid, such as formic acid (HCOOH) and a diluent gas is supplied to the wafer that has been heated to a predetermined temperature, so as to remove the copper oxide 13a. Due to this process, by a reduction of the copper oxide 13a in accordance with the following reaction formula (1), or by a physical etching action of the formic acid, metal copper is generated on a bottom of the recess 21.

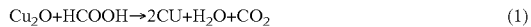

$$Cu_2O + HCOOH \rightarrow 2CU + H_2O + CO_2 \qquad (1)$$

Alternatively, the process for removing the copper oxide 13a may be carried out by supplying a plasma obtained by making plasma a hydrogen gas, so as to reduce the copper oxide 13a.

Then, as shown in FIG. 2(a), a barrier layer 30 made of an oxide of manganese is formed over all the inside surface of the recess 21. The barrier layer 30 is formed as follows. A steam of an organic compound of manganese, which will be described below, a hydrogen ($H_2$) gas as a carrier gas, and a gas containing an oxygen for forming an oxide of manganese, such as an oxygen ($O_2$) gas, are supplied at predetermined flow rates into a processing vessel, under process conditions in which a wafer temperature is e.g., 100 to 200° C. and a process atmospheric pressure is e.g., 13.3 to 133 Pa (0.1 to 1 Torr). Then, in the processing vessel, Mn atoms in the steam and O atoms in the oxygen gas are reacted with each other by the heat, whereby an oxide of manganese is deposited over all the inside surface of the recess 21 including an end surface of the etching stop layer 15. A thickness of the barrier layer 30 made of the oxide of manganese is 2.0 nm, for example. Since it is difficult for the Mn atoms and the O atoms to enter a deep part of the recess 21, a film thickness of the oxide of manganese on the deep part is significantly smaller than a film thickness of the oxide of manganese formed on a part near to the opening of the recess 21. Namely, the film thickness of the oxide of manganese can be formed as a thickness that does not give an influence on an electrical connection between the copper wiring 32 in the upper layer (upper copper wiring 32), which will be described below, and the lower copper wiring 13.

Figure 5:
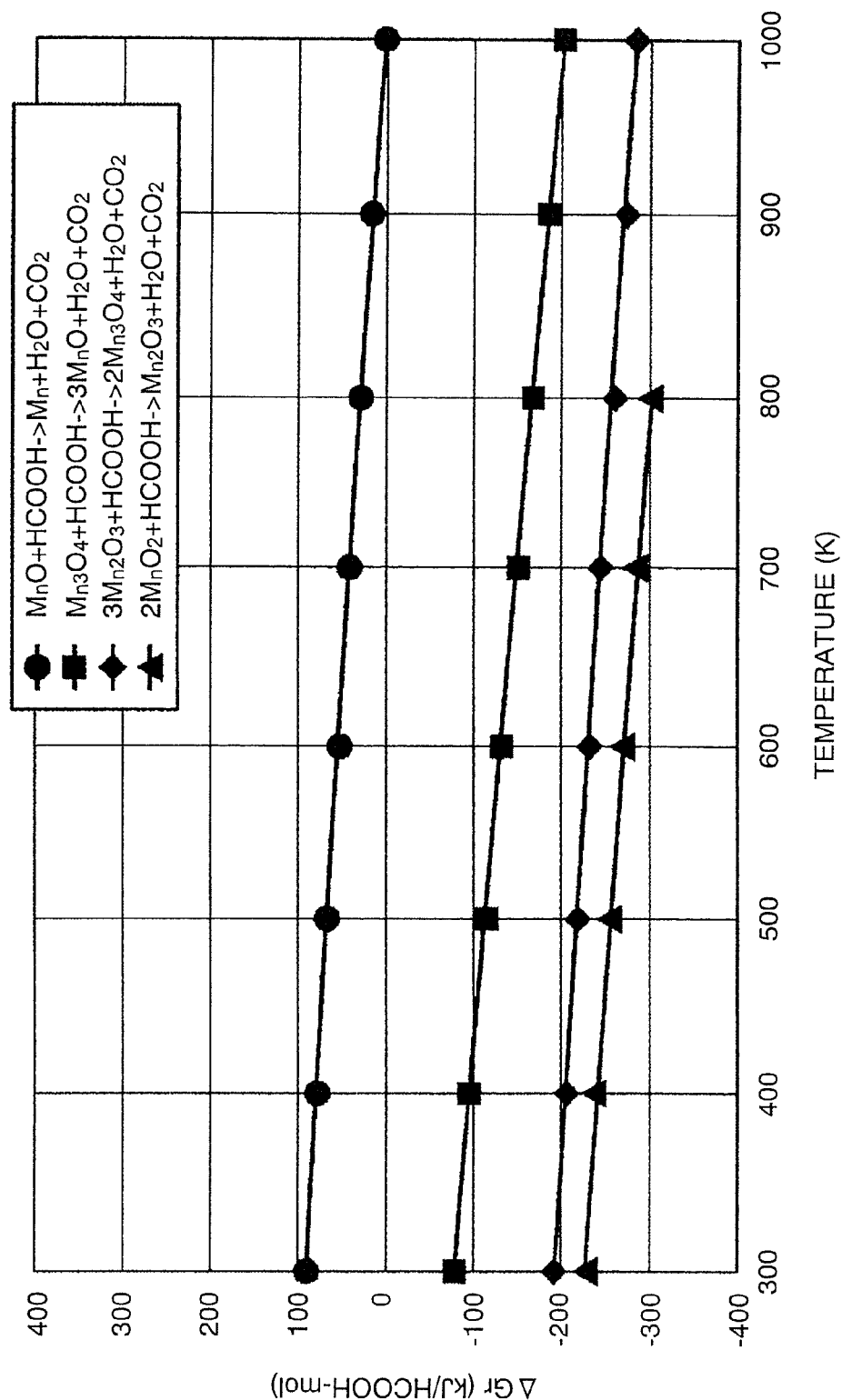
FIG. 5 is a view for explaining a relationship between a Gibbs free energy and a reaction temperature, when formic acid is supplied to an oxide of manganese.

Following thereto, as shown in FIG. 2(b), a mixed gas of a steam of carboxylic acid, which is organic acid, such as formic acid (HCOOH) and a diluent gas is supplied to the wafer that has been heated to a predetermined temperature. FIG. 5 shows data showing a relationship between a Gibbs free energy and a reaction temperature when formic acid is supplied to an oxide of manganese. As understood from FIG. 5, since the oxide of manganese forming the barrier layer 30 is manganese oxide (MnO), ΔG is slightly positive at a temperature of 400° C. Thus, not all the MnO is reduced to Mn, but a part thereof is reduced so as to generate stoichiometric imbalance in the MnO. Therefore, a ratio of manganese in the oxide of manganese forming the barrier layer 30 is increased. By processing the barrier layer 30 with the formic acid, the manganese concentration is increased. In addition, there remains excessive manganese which did not react with the oxygen gas when the barrier layer 30 was formed. As a result, the manganese concentration on the surface of the barrier layer 30 or in the barrier layer 30 is increased.

Thereafter, as shown in FIG. 2(c), a seed layer 31 mainly made of copper is formed on the surface of the barrier layer 30 by a sputtering method. In this example, the seed layer 31, the lower copper wiring 13, and the upper copper wiring 32, which will be described below, are made of copper. However, not limited thereto, it is possible to use, e.g., CuAg alloy whose specific resistance is less apt to increase.

After that, as shown in FIG. 3(a), an annealing process, which is a heating process, is performed at a predetermined temperature, while an oxygen gas is being supplied. Due to the annealing process, the manganese on the surface of the barrier layer 30 and/or the manganese in the barrier layer 30 move to the surface side of the seed layer 31 so as to be separated out onto the surface of the seed layer 31. The separated-out manganese is oxidized by the oxygen gas supplied thereto. Thus, as shown in FIG. 3(b), a MnO layer 110 is formed on the surface of the seed layer 31. Then, as shown in FIG. 3(c), a cleaning liquid such as sulfuric acid is supplied to the wafer, so as to remove the MnO film 110. Not limited to sulfuric acid, the cleaning liquid may be hydrofluoric acid, a mixed liquid of sulfuric acid and hydrogen peroxide, or a mixed liquid of hydrofluoric acid and hydrogen peroxide. After the wafer has been cleaned, as shown in FIG. 4(a), for example, the copper wiring 32, which is mainly made of copper and serves as the upper conductive channel, is formed so as to be embedded in the recess 21 by electroplating, for example.

Thereafter, as shown in FIG. 4(b), the copper wiring 32 protruding from the recess 21 is removed by CMP. At this time, since the barrier layer 30 is insulative, the barrier layer 30 formed between the copper wiring 32 and the interlayer insulating film 20 does not cause an increase of dielectric constant. Thus, the barrier layer 30 may be left as it is. Alternatively, the barrier layer 30 may be removed. After that, as shown in FIG. 4(c), under the same temperature and pressure conditions as described above, a steam of an organic compound of manganese, a hydrogen gas as a carrier gas, and a gas containing an oxygen for forming an oxide of manganese, such as an oxygen gas, are supplied at predetermined flowrates, so that a barrier layer (cap layer) 101 made of an oxide of manganese is formed on the copper wiring 32 and the interlayer insulating film 20, whereby an upper circuit layer 2 is formed.

According to the above embodiment, after the barrier layer 30 made of the oxide of manganese has been formed, the organic acid is supplied to the wafer so as to reduce a part of the oxide of manganese forming the barrier layer 30. Thus, the stoichiometric imbalance is generated in the composition ratio in the oxide of manganese, so that a ratio of manganese in the oxide of manganese is increased. Therefore, the barrier layer 30 and the copper wiring 32 can closely adhere to each other, with the copper seed layer 31 therebetween. For this reason, there is no possibility that the copper wiring 32 peels and becomes defective.

In addition, the supply of the organic acid increases the manganese concentration. Further, there remains the excessive manganese which did not react with the oxygen gas when the barrier layer 30 was formed. Thus, the manganese concentration on the surface of the barrier layer 30 and/or in the barrier layer 30 is increased. However, since the manganese on the surface of the barrier layer 30 and/or the manganese in the barrier layer 30 are removed in the following manner, there is no possibility that the electric resistance of the copper wiring 32 is increased. Namely, after the formation of the copper seed layer 31, the manganese on the surface of the barrier layer 30 and/or the manganese in the barrier layer 30 are separated out on the surface of the seed layer 31 by a heating process. Then, the separated-out manganese is removed by the cleaning process before the formation of the copper wiring 32 in the recess 21.

In the above embodiment, before the upper copper wiring 32 is formed in the recess 21, the manganese on the surface of the barrier layer 30 and/or in the barrier layer 30 is removed outside the barrier layer 30. Thus, there is no possibility that the manganese remains in the upper copper wiring 32. Otherwise, the content of manganese in the upper copper wiring 32 can be reduced.

According to the above embodiment, by reacting the steam of an organic compound of manganese and the gas containing oxygen for forming an oxide of manganese with each other, the barrier layer 30 made of an oxide of manganese is formed to cover the upper surface of the interlayer insulating film 20 and the overall inside surface of the recess 21. Thus, a coating property of the barrier layer 30 in the recess 21 can be improved, whereby there can be obtained an excellent barrier property against diffusion of copper from the upper copper wiring 32 to the interlayer insulating film 20.

When a Ta/TaN laminate body is used as a barrier layer, since the laminate body is a conductor, the barrier layer 30 formed on the interlayer insulating film 20 should be removed by a CMP process. On the other hand, since the barrier layer 30 made of an oxide of manganese is an insulator, it is not necessary to remove the barrier layer 30 formed on the interlayer insulating film 20 by a CMP process. Thus, the manufacturing method can be simplified and the cost thereof can be reduced.

In the above embodiment, by reacting the steam of an organic component of manganese and the oxygen gas with each other, the barrier layer 30 made of MnO is formed to cover the upper surface of the interlayer insulating film 20 and the overall inside surface of the recess 21. However, not limited thereto, the following method may be carried out. Namely, a steam of an organic metal compound such as $(EtCp)_2Mn$ (bis-ethylcyclopentadienyl manganese), which is a precursor containing manganese and not containing oxygen, is supplied to be reacted with oxygen, carbon, or silicon, which is one of components contained in the interlayer insulating film 20 and the etching stop layer 15, so as to form a barrier layer made of, e.g., manganese oxide ($MnO_x$ (x: a given positive number)), or manganese carbide ($MnC_x$ (x: a given positive number)), or manganese oxide carbide ($MnC_xO_y$ (x, y: given positive numbers)), or manganese oxide silicide ($MnSi_xO_y$ (x, y: given positive numbers)), or manganese carbide silicide ($MnSi_xC_y$ (x, y: given positive numbers)), or manganese oxide carbide silicide ($MnSi_xC_yO_z$ (x, y, z: given positive numbers)). Then, similarly to the above, organic acid is supplied to the barrier layer, so that a part of the compound of manganese forming the barrier layer is reduced. Thus, stoichiometric imbalance is generated in the composition ratio in the oxide of manganese, so that a ratio of manganese in the compound of manganese is increased. Also in the above manner, the barrier layer and the copper wiring 32 can closely adhere to each other, with the copper seed layer 31 therebetween.

Second Embodiment

Figure 6:
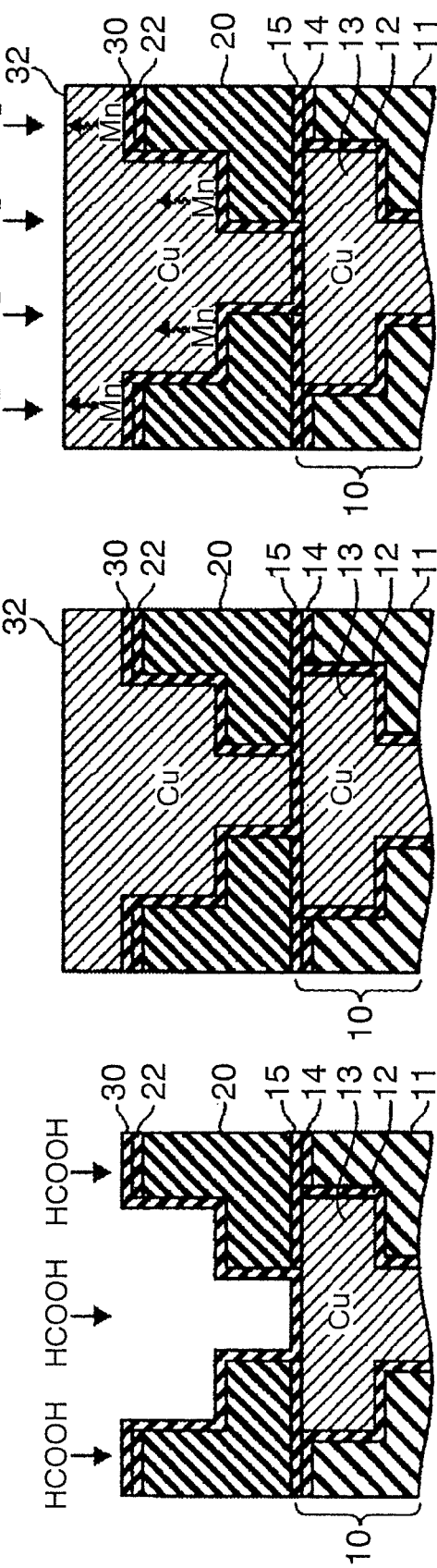
FIG. 6 includes views showing another manufacturing procedure of a semiconductor device according to the present invention.

Another embodiment of the method of manufacturing a semiconductor device according to the present invention is described. In this embodiment, a CVD method is used as a method for embedding copper in the recess 21. A process for forming the upper circuit layer 2 on the lower circuit layer 10 in this embodiment is described. The barrier layer 30 is formed on a wafer by the same method as that of the first embodiment. Then, as shown in FIG. 6(a), similarly to the above, the barrier layer 30 is processed with formic acid (process for increasing a ratio of Mn in an oxide of manganese). Thereafter, as shown in FIG. 6(b), the upper copper wiring 32 is formed on the barrier layer 30 so as to be embedded in the recess 21 by a CVD method. Then, as shown in FIG. 6(c), an annealing process is carrier out similarly to the above. Due to the annealing process, manganese on the surface of the barrier layer 30 and/or in the barrier layer 30 moves to the surface side of the copper wiring 32, so as to be separated out on the surface of the copper wiring 32. The separated-out manganese is oxidized by an oxygen gas supplied thereto. Thus, as shown in FIG. 7(a), the MnO layer 100 is formed on the surface of the upper copper wiring 32.

Figure 7:
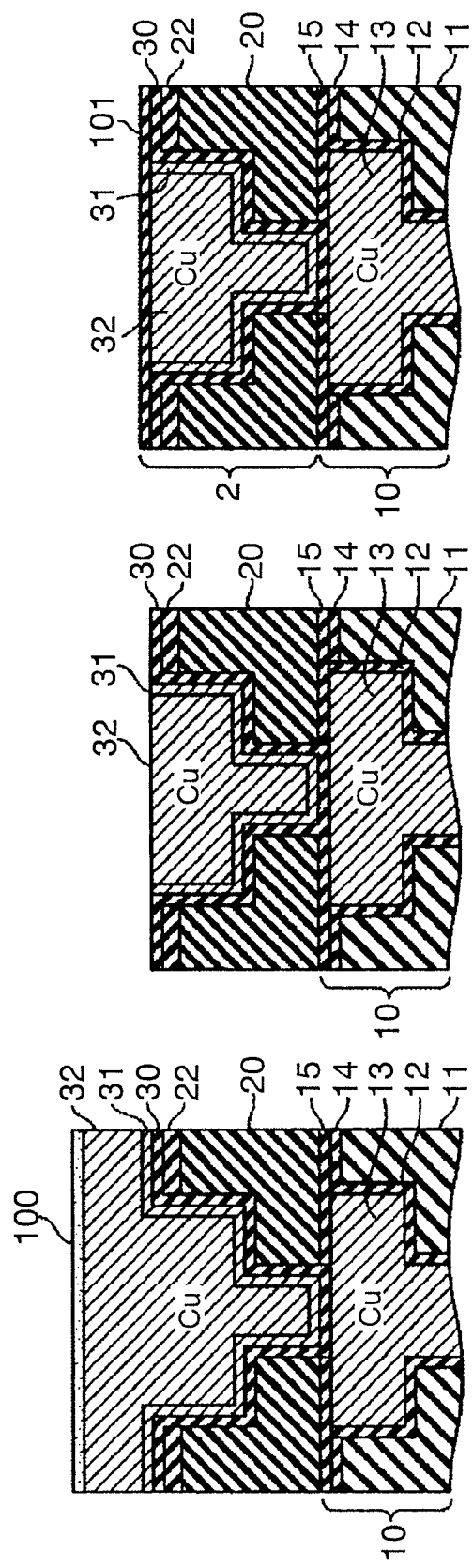
FIG. 7 includes views showing further another manufacturing procedure of the semiconductor device according to the present invention.

After that, as shown in FIG. 7(b), the copper wiring 32 protruding from the recess 21 is removed by CMP. In accordance therewith, the MnO layer 100 formed on the surface of the copper wiring 32 is removed. Thereafter, as shown in FIG. 7(c), similarly to the above, the barrier layer (cap layer) 101 is formed on the copper wiring 32 and the interlayer insulating film 20.

According to this embodiment, since a CVD method is used for embedding copper in the recess 21, the upper copper wiring 32 can be directly formed on the barrier layer 30, without forming the seed layer 31. Thus, the manufacturing process can be simplified and the cost can be reduced.

(Apparatus Structure)

Figure 8:
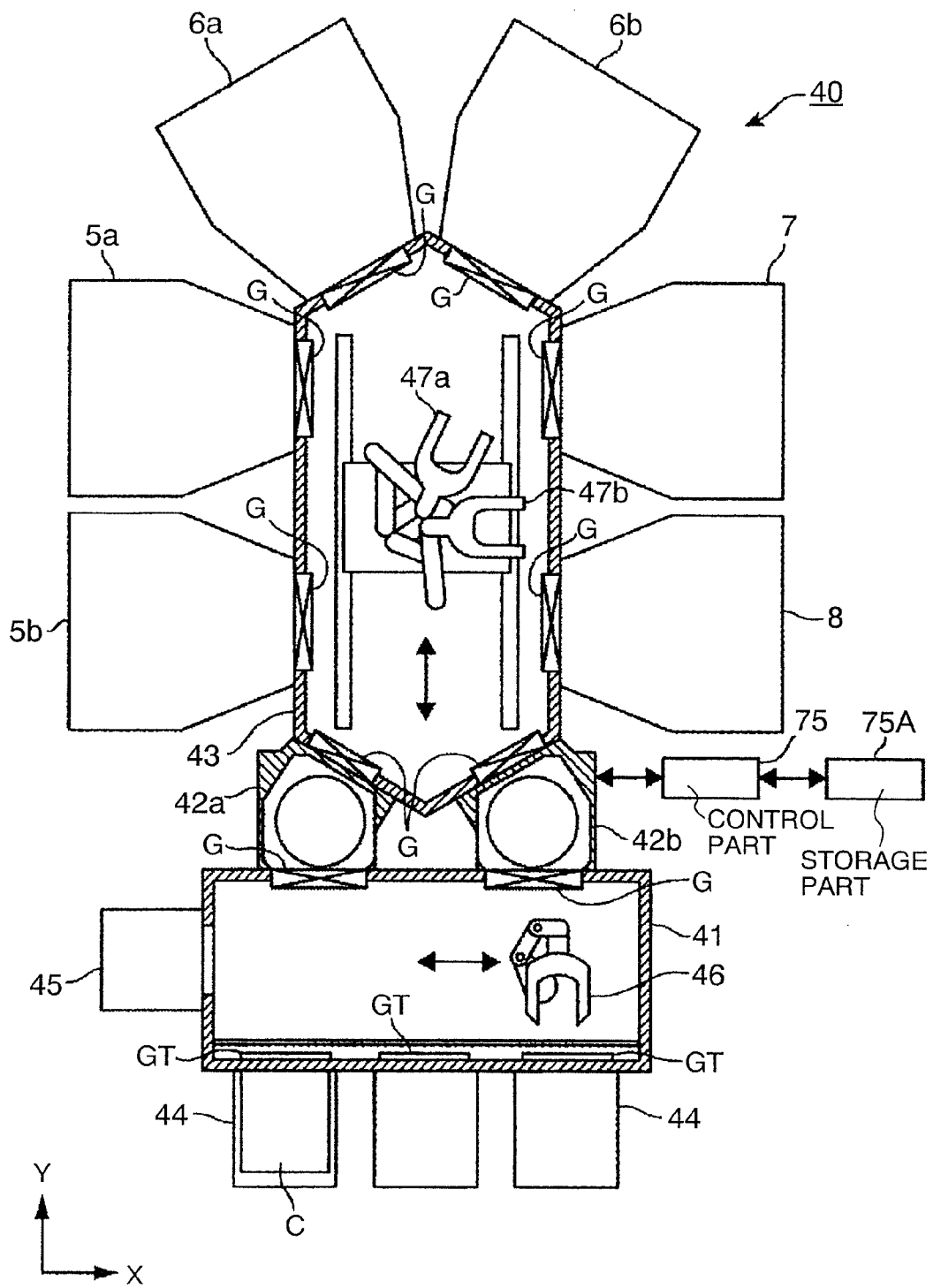
FIG. 8 is a plan view showing a semiconductor manufacturing apparatus in an embodiment according to the present invention.

FIG. 8 shows a semiconductor manufacturing apparatus configured to carry out the aforementioned second embodiment. As shown in FIG. 8, the semiconductor manufacturing apparatus 40 provides a multi-chamber system. A first transfer chamber 41 under an atmosphere of air, load-lock chambers 42a and 42b arranged in a right and left direction, for example, and a second transfer chamber 43 as a vacuum transfer chamber module, are connected via gates G, in this order from below in FIG. 8. In the load-lock chambers 42a and 42b, wafers can wait under either a vacuum atmosphere or an atmosphere of air. An inside of the second transfer chamber 43 is set to be under a vacuum atmosphere, for example, in order that the copper wiring 13 is not oxidized. In front of the first transfer chamber 41, there are laterally disposed three load ports 44, for example. A hermetically sealable carrier C containing a plurality of, e.g., twenty five wafers can be placed on each load port 44. The carrier C placed on the load port 44 is connected to a front wall of the first transfer chamber 41. The front wall of the first transfer chamber 41 is provided with gate doors GT, each of which is opened and closed together with a lid of the carrier C. Disposed on a side surface of the transfer chamber 41 is an alignment chamber 45, which is configured to adjust a direction (orientation) and an eccentricity of a wafer. To the second transfer chamber 43, there are hermetically connected formic-acid processing modules 5a and 5b, manganese-oxide CVD modules 6a and 6b, a Cu-CVD module 7, and an annealing module 8, through gates G. The formic-acid processing modules 5a and 5b are oxide removing modules also serving as organic-acid supplying modules. The manganese-oxide CVD modules 6a and 6b are barrier-layer forming modules. The Cu-CVD module 7 is a conductive-channel forming module. The annealing module 8 is a heating module.

The first transfer chamber 41 and the second transfer chamber 43 are respectively provided with a first transfer unit 46, and second transfer units 47a and 47b. The first transfer unit 46 is a transfer arm configured to transfer a wafer between the carrier C and the load-lock chambers 42 and 42b, and between the first transfer chamber 41 and the alignment chamber 45. The second transfer units 47a and 47b are respectively transfer arms configured to transfer a wafer among the load-lock chambers 42a and 42b, the formic-acid processing modules 5a and 5b, the manganese-oxide CVD modules 6a and 6b, the Cu-CVD module 7, and the annealing module 8.

Figure 9:
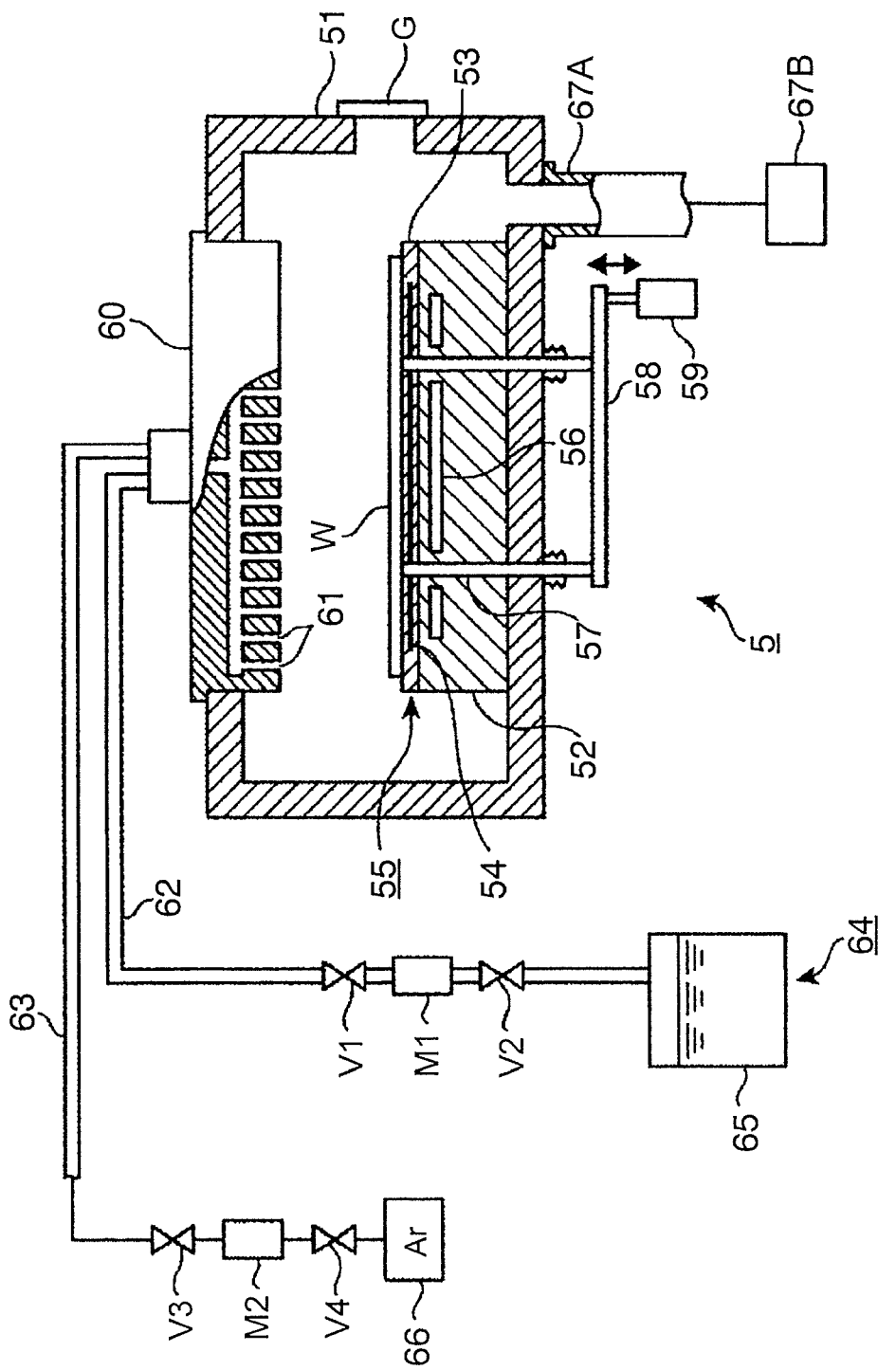
FIG. 9 is a longitudinal sectional view of a formic-acid processing module included in the semiconductor manufacturing apparatus.

The structure of the formic-acid processing module 5 (5a, 5b) included in the semiconductor manufacturing apparatus 40 is described with reference to FIG. 9. The reference number 51 in FIG. 9 depicts a processing vessel providing a vacuum chamber. A stage 52 on which a wafer can be placed is disposed on a bottom of the processing vessel 51. Disposed on a surface of the stage 52 is an electrostatic chuck 55 to which a chuck voltage is applied from a power source, not shown.

A heater 56 is disposed inside the stage 52, so that a wafer can be heated to a predetermined temperature. The stage 52 is provided with elevating pins 57 which elevate and lower a wafer, for transferring the wafer between the stage 52 and the second transfer units 47a and 47b. The elevating pins 57 are elevated and lowered by a drive part 59 through a support member 58.

A gas showerhead 60 is disposed above the processing vessel 51 such that the gas showerhead 60 is opposed to the stage 52. A large number of gas supply holes 61 are formed in a lower surface of the gas showerhead 60. Connected to the gas showerhead 60 are a first gas supply path 62 and a second gas supply path 63. The first gas supply path 62 is configured to supply a steam of carboxylic acid, which is organic acid, such as formic acid, for increasing a ratio of manganese in an oxide of manganese forming the barrier layer 30. The second gas supply path 63 is configured to supply a diluent gas. The steam of organic acid and the diluent gas, which have been supplied from the gas supply paths 62 and 63, are mixed in the gas showerhead 60, and supplied into the processing vessel 51 through the gas supply holes 61.

The first gas supply path 62 is connected to a material supply source 64 via a valve V1, a mass-flow controller M1 as an adjusting unit of a flow rate of the gas, and a valve V2. The material supply source 64 has a stainless storage vessel 65 in which organic acid is stored. The second gas supply path 63 is connected to a diluent-gas supply source 66 for supplying a diluent gas such as an argon (Ar) gas, via a valve V3, a mass-flow controller M2, and a valve V4.

One end of an exhaust pipe 67A is connected to a bottom surface of the processing vessel 51. A vacuum pump 67B as vacuum exhaust means is connected to the other end of the exhaust pipe 67A. By a pressure adjusting mechanism, not shown, a pressure inside the processing vessel 51 can be maintained at a predetermined pressure during the formic-acid process.

Figure 10:
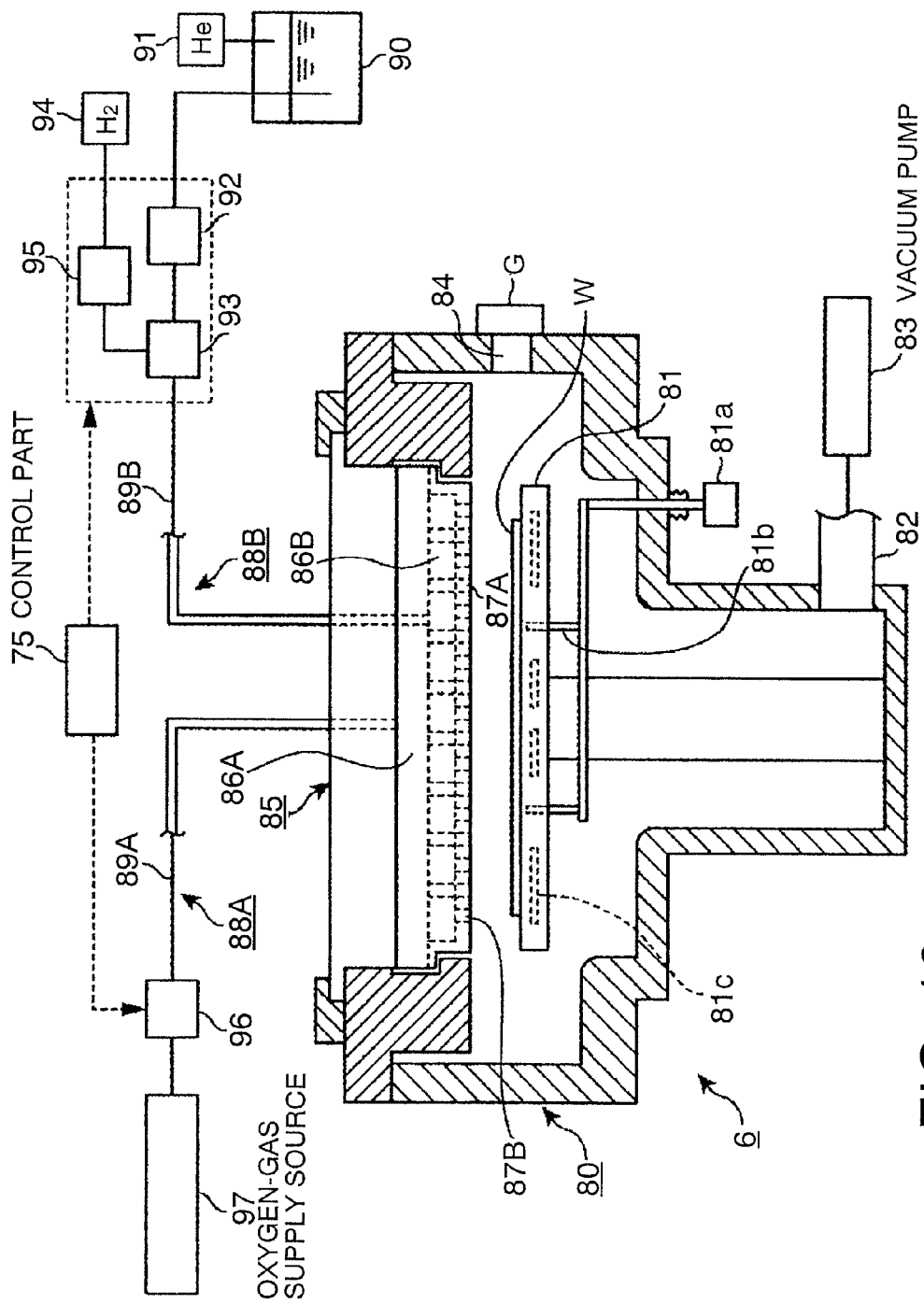
FIG. 10 is a longitudinal sectional view of a manganese-oxide CVD module included in the semiconductor manufacturing apparatus.

With reference to FIG. 10, the manganese-oxide CVD module 6 (6a, 6b) is described. The reference number 80 in FIG. 10 depicts a processing vessel providing a vacuum chamber. A stage 81 on which the wafer can be horizontally placed is disposed in the processing vessel 80. A heater 81c as means for adjusting a temperature of the wafer is disposed in the stage 81. The stage 81 is provided with three elevating pins 81b (only two pins are illustrated as a matter of convenience) that can be elevated and lowered by an elevating mechanism 81a. A wafer is transferred between the second transfer units 47a and 47b and the stage 81 via the elevating pins 81b. One end of an exhaust pipe 82 is connected to a bottom part of the processing vessel 80, and a vacuum pump 83 is connected to the other end of the exhaust pipe 82. A transfer opening 84 that is opened and closed by the gate valve G is formed in a side wall of the processing vessel 80.

A gas showerhead 85 opposed to the stage 81 is disposed on a ceiling part of the processing vessel 80. The gas showerhead 85 has gas chambers 86A and 86B separated from each other. Gases supplied into the gas chambers 86A and 86B are respectively supplied into the processing vessel 80 from gas supply holes 87A and 87B.

Connected to the gas showerhead 85 is an oxygen-gas supply pipe system 88A for introducing a gas containing oxygen for forming an oxide of manganese, such as an oxygen ($O_2$) gas, into the gas chamber 86A. The oxygen-gas supply pipe system 88A has an oxygen-gas supply path 89A. An oxygen-gas supply source 97 is connected to an upstream side of the oxygen-gas supply path 89A. The reference number 96 in FIG. 10 depicts a flow-rate adjusting part that receives a control signal from a control part 75, which will be described below, and adjusts a flow rate of the oxygen gas so as to control supply and not-supply of the oxygen gas into the gas chamber 86A.

In addition, connected to the gas showerhead 85 is a Mn material-gas supply pipe system 88B for introducing a steam of an organic compound of manganese into the gas chamber 86B. The Mn material-gas supply pipe system 88B has a material-gas supply path 89B. A material storage part 90 is connected to an upstream side of the material-gas supply path 89B. The material storage part 90 stores an organic compound of manganese, such as $(EtCp)_2Mn$ (bis-ethylcyclopentadienyl manganese) in a liquid state. A pressurizing part 91 is connected to the material storage part 90. Thus, by pressurizing an inside of the material storage part 90 by an He gas or an Ar gas supplied from the pressurizing part 91, $(EtCp)_2Mn$ can be sent toward the gas showerhead 85.

Connected to the material-gas supply path 89B are a flow-rate adjusting part 92 including a liquid mass-flow controller and a valve, and a vaporizer 93 for vaporizing the $(EtCp)_2Mn$, in this order from the upstream side. A function of the vaporizer 93 is to vaporize the $(EtCp)_2Mn$ by bringing the $(EtCp)_2Mn$ and an $H_2$ gas, which is a carrier gas and is supplied from a carrier-gas supply source 94, into contact with each other so as to be mixed, and to supply the vaporized $(EtCp)_2Mn$ into the gas chamber 86B. The reference number 95 in FIG. 10 is a flow-rate adjusting part that receives a control signal from the control part 75, which will be described below, and adjusts a flow rate of the carrier gas so as to control supply and not-supply of the steam of the organic compound of manganese into the gas chamber 86B.

The Cu-CVD apparatus 7 has the same structure as that of the CVD apparatus shown in FIG. 10, excluding that a material storage part 90 stores an organic compound of copper, such as Cu(hfac)(tmvs). The annealing module 8 consists of: a processing vessel; a stage disposed in the processing vessel, for placing thereon a wafer; a heater as heating means embedded in the stage; and a gas supply unit for supplying an oxygen gas.

As shown in FIG. 8, the semiconductor manufacturing apparatus 40 is equipped with the control part 75 formed of, e.g., a computer. The control part 75 includes a program, a memory, and a data processing unit formed of a CPU. The program incorporates commands (respective steps) for carrying out the aforementioned respective steps by sending control signals from the control part 75 to the respective components of the semiconductor manufacturing apparatus 40. For example, the memory has an area to which values of process parameters such as a process pressure, a process temperature, a process period, gas flow rates, and an electric power are written. When the CPU executes the respective commands of the program, these process parameters are read out, and control signals corresponding to the read-out parameter values are sent to the respective components of the semiconductor manufacturing apparatus 40. The program (including a program relating to an input operation of the process parameters and a display thereof) is stored in a storage part 75A that is a computer storage medium such as a flexible disc, a compact disc, a hard disc, or an MO (magnetoptical disc), and is installed in the control part 75.

Next, there is described a flow (movement) of a wafer, up to a step in which the upper circuit layer 2 is formed on the lower circuit layer 10 in the semiconductor manufacturing apparatus 40. At first, the carrier C is transferred to the semiconductor manufacturing apparatus 40 by a transfer unit, not shown. The carrier C is placed on the load port 44 and connected to the first transfer chamber 41. Then, the gate door GT and the lid of the carrier C are simultaneously opened, and a wafer in the carrier C is loaded into the first transfer chamber 41 by the first transfer unit 46. Then, the wafer is transferred to the alignment chamber 45, and a direction (orientation) and an eccentricity of the wafer are adjusted. Thereafter, the wafer is transferred to the load-lock chamber 42a (or 42b). After a pressure in the load-lock chamber 42a (or 42b) has been adjusted, the wafer is transferred to the formic-acid processing module 5a (or 5b) by the second transfer unit 47a (or 47b) from the load-lock chamber 42a (or 42b) via the second transfer chamber 43. The inside of the processing vessel 51 is vacuumized by the vacuum pump 67B and set at a predetermined pressure, and the wafer is heated to a predetermined temperature by the heater 56 of the stage 52. By opening the valves V1 and V2, the inside of the processing vessel 51 and the inside of the storage vessel 65 are communicated with each other. Thus, a steam of formic acid in the storage vessel 65 enters the gas showerhead 60 through the first gas supply path 62, at a flow rate adjusted by the mass-flow controller M1. On the other hand, by opening the valves V3 and V4, an Ar gas as a diluent gas enters the gas showerhead 60 from the diluent-gas supply source 66 through the second gas supply path 63, at a flow rate adjusted by the mass-flow controller M2. In the gas showerhead 60, the steam of formic acid and the Ar gas are mixed with each other, and the mixture is supplied to the wafer from the gas supply holes 61 of the gas showerhead 60. Thus, the copper oxide 13a is removed.

After the removal process, the wafer is loaded into the processing vessel 80 of the manganese-oxide CVD module 6a (or 6b) via the second transfer chamber 43. The inside of the processing vessel 80 is vacuumized by the vacuum pump 83 and set at a predetermined pressure, and the wafer is heated to a predetermined temperature by the heater 81c of the stage 81. Then, $(EtCp)_2Mn$ of an adjusted flow rate and an $H_2$ gas as a carrier gas of an adjusted flow rate are mixed by the vaporizer 93, and the mixed gas is supplied to the wafer from the gas supply holes 87B of the gas showerhead 85 through the material-gas supply path 89B. In addition, an $O_2$ gas of an adjusted flow rate is supplied to the wafer from the gas supply holes 87A of the gas showerhead 85 through the material-gas supply path 89A, so that the barrier layer 30 is formed. As described above, when there is formed a barrier layer made of $MnO_x$ (x: a given positive number), or $MnC_x$ (x: a given positive number), or $MnC_xO_y$ (x, y: given positive numbers), or $MnSi_xO_y$ (x, y: given positive numbers), or $MnSi_xC_y$ (x, y: given positive numbers), or $MnSi_xC_yO_z$ (x, y, z: given positive numbers), only the mixed gas of the $(EtCp)_2Mn$ and the $H_2$ gas as a carrier gas is supplied to the wafer, without supplying an $O_2$ gas to the wafer.

After the formation of the barrier layer 30 has been finished, the wafer is transferred to the formic-acid processing module 5b (or 5a) through the second transfer chamber 43. Then, similarly to the above, the mixed gas of the steam of formic acid and the Ar gas is supplied to the wafer from the gas supply holes 61 of the gas showerhead 60 so as to perform the process for increasing a ratio of manganese in the oxide of manganese forming the barrier layer 30. Thereafter, the wafer is transferred to the Cu-CVD module 7 via the second transfer chamber 43. Then, the inside of the processing vessel 80 is vacuumized by the vacuum pump 83 and set at a predetermined pressure, and the wafer is heated to a predetermined temperature by the heater 81c of the heater 81. Then, an organic compound of copper of an adjusted flow rate and an $H_2$ gas as a carrier gas of an adjusted flow rate are mixed with each other by the vaporizer 93. By supplying the mixed gas to the wafer from the gas supply holes 87B of the gas showerhead 85, the upper wiring layer 32 made of Cu is formed.

After the formation of the copper wiring 32 has been finished, the wafer is transferred to the annealing module 8 via the second transfer chamber 43, and the aforementioned annealing process is performed. Thereafter, the wafer is transferred to the load-lock chamber 42a (or 42b) via the second transfer chamber 43. After the pressure in the load-lock chamber 42a (or 42b) is returned to an atmospheric pressure, the wafer is returned to the carrier C by the first transfer unit 46 via the first transfer chamber 41. After the respective wafers are returned to the carrier C, the carrier C is transferred to a CMP apparatus by a transfer unit, not shown. Then, the wafers are taken out from the carrier C, and are subjected to the CMP process in the CMP apparatus. Thereafter, the carrier C is transferred to the semiconductor manufacturing apparatus 40 by the transfer unit, not shown. In the manganese-oxide CVD module 6a (or 6b), the barrier layer (cap layer) 101 is formed on the copper wiring 32 and the interlayer insulating film 20, so that the upper circuit layer 2 is formed.

Figure 11:
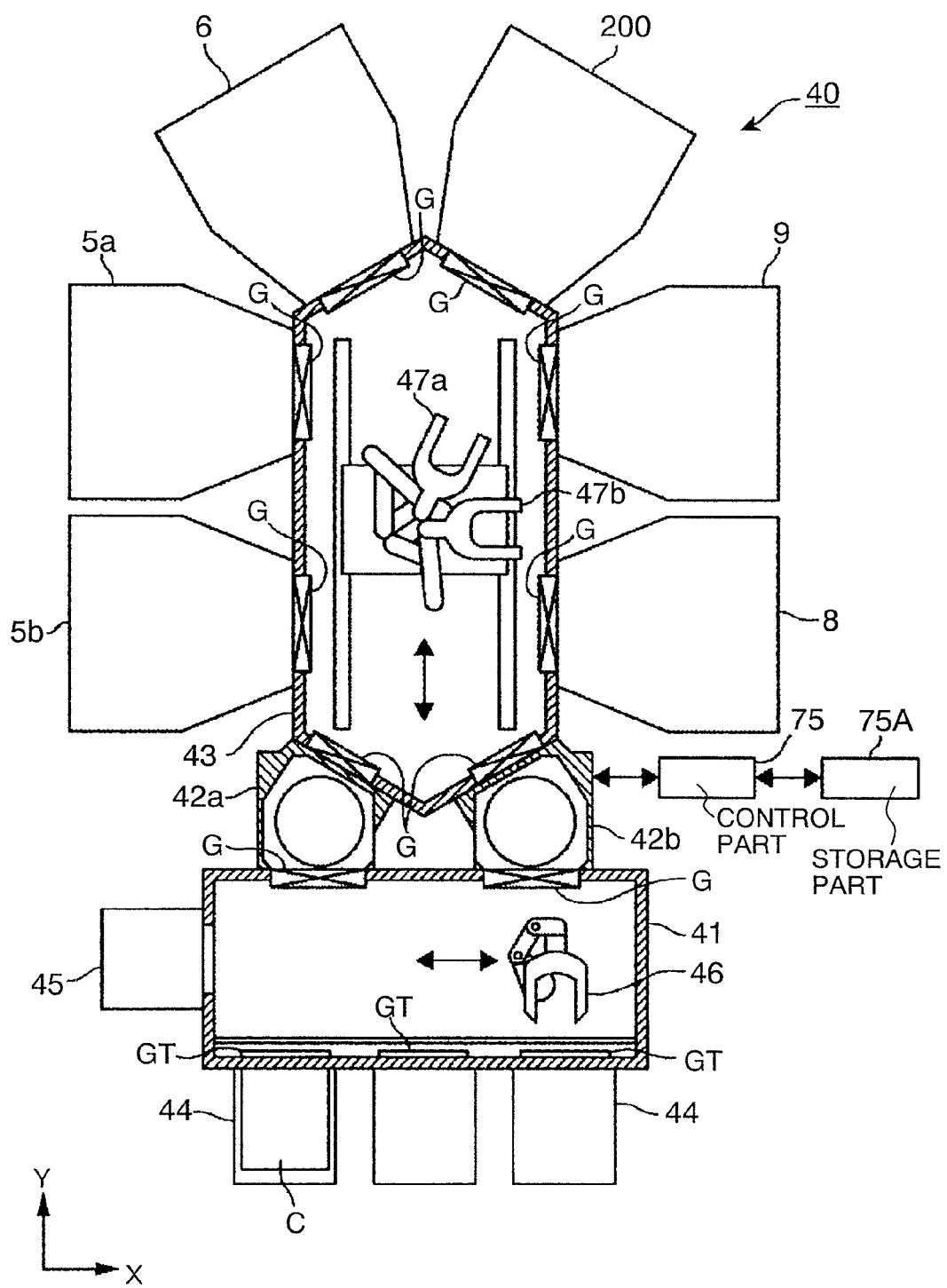
FIG. 11 is a plan view showing a semiconductor manufacturing apparatus in another embodiment according to the present invention.

As an alternative example of the above semiconductor manufacturing apparatus 40, the semiconductor manufacturing apparatus 40 shown in FIG. 8 may include a Cu-PVD module 9 as a seed-layer forming module, instead of the Cu-CVD module 7, and a cleaning-liquid supplying module 200. FIG. 11 shows the semiconductor manufacturing apparatus 40 in this embodiment. In this case, after the seed layer 31 has been subjected to the annealing process, the process for removing the MnO film 110 is carried out in the cleaning-liquid supplying module 200. Then, the wafer is subjected to an electroplating process outside the semiconductor manufacturing apparatus 40, for example, and the CMP process in the CMP apparatus. Namely, the flow of the wafer is as follows, i.e., the wafer is transferred to the formic-acid processing module 5 (process for removing the copper oxide), the manganese-oxide CVD module 6, the formic-acid processing module 5 (process for increasing the ratio of Mn in the oxide of manganese), the Cu-PVD module 9, the annealing module 8, and the cleaning-liquid supplying module 200, the electroplating apparatus, and the CMP apparatus, in this order.

Figure 12:
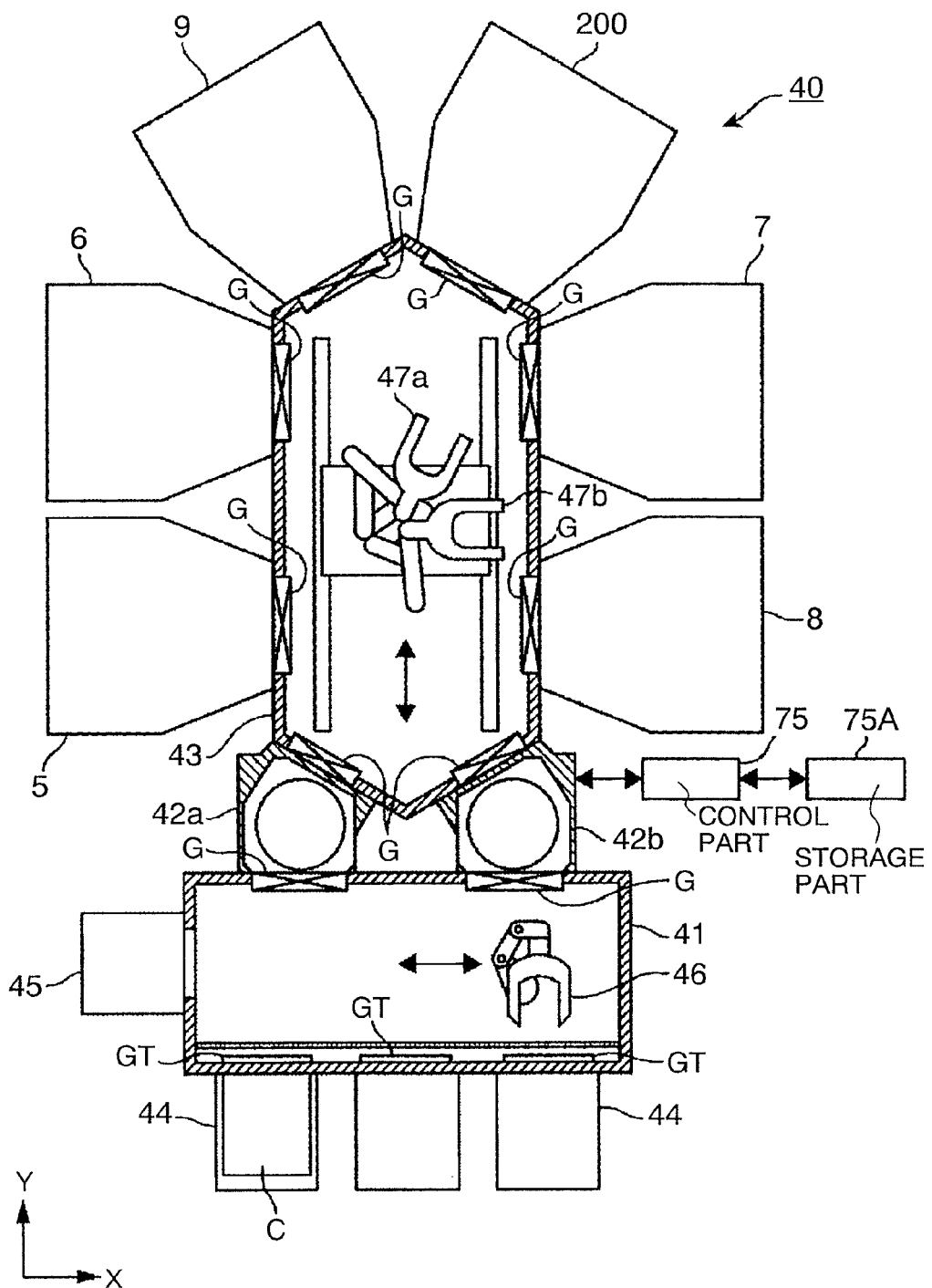
FIG. 12 is a plan view showing a semiconductor manufacturing apparatus in another embodiment according to the present invention.

As an alternative example of the above semiconductor manufacturing apparatus 40, the semiconductor manufacturing apparatus 40 shown in FIG. 8 may further include the Cu-PVD module 9 as a seed-layer forming module, and the cleaning-liquid supplying module 200. FIG. 12 shows the semiconductor manufacturing apparatus 40 in this embodiment. In this case, after the seed layer 31 has been subjected to the annealing process, the process for removing the MnO film 110 is carried out in the cleaning-liquid supplying module 200. Then, embedment of copper is performed in the Cu-CVD module. Namely, the flow of the wafer is as follows, i.e., the wafer is transferred to the formic-acid processing module 5 (process for removing the copper oxide), the manganese-oxide CVD module 6, the formic-acid processing module 5 (process for increasing the ratio of Mn in the oxide of manganese), the Cu-PVD module 9, the annealing module 8, the cleaning-liquid supplying module 200, the Cu-CVD module 6, and the CMP apparatus, in this order.

In the above embodiments, the barrier layer 30 is formed by a so-called thermal CVD method in which a wafer is heated while a steam of an organic compound of manganese and an oxygen gas are being supplied to the wafer. However, a plasma CVD method or an optical CVD method may be employed to form the barrier layer 30. In addition, as an alternative of these CVD methods, there may be used an ALD (Atomic Layer Deposition) method in which a steam of an organic compound of manganese and an oxygen gas are intermittently supplied to a wafer, so that the barrier layer 30 is formed of laminated very thin films. Further, when copper is embedded in the recess 21, an electroless plating method may be employed in place of an electroplating method.

The invention claimed is:

1. A method of manufacturing a semiconductor device comprising:

forming a recess in an interlayer insulating film formed on a substrate surface, the recess being configured to be embedded with an upper conductive channel mainly made of copper to be electrically connected to a lower conductive channel;

supplying a gas containing an organic compound of manganese, and forming a barrier layer made of a compound of manganese for preventing diffusion of copper to the interlayer insulating film, such that the barrier layer covers an exposed surface of the interlayer insulating film;

after the formation of the barrier layer, supplying organic acid to the barrier layer in order to increase a ratio of manganese in the compound of manganese forming the barrier layer;

after the supply of the organic acid, forming a seed layer mainly made of copper on a surface of the barrier layer;

after the formation of the seed-layer, heating the substrate in order to separate out manganese from on the surface of the barrier layer or from in the barrier layer onto a surface of the seed layer;

supplying a cleaning liquid to the seed layer in order to remove the manganese separated out on the surface of the seed layer by the heating; and after the supply of the cleaning liquid, forming the upper conductive channel mainly made of copper in the recess.

2. The method of manufacturing a semiconductor device according to claim 1, further comprising after the formation of the upper conductive channel in the recess, reacting a steam of an organic compound of manganese and a gas containing oxygen for forming an oxide of manganese with each other, and forming a barrier layer made of the oxide of manganese on the upper conductive channel.

3. A method of manufacturing a semiconductor device comprising:

forming a recess in an interlayer insulating film formed on a substrate surface, the recess being configured to be embedded with an upper conductive channel mainly made of copper to be electrically connected to a lower conductive channel;

supplying a gas containing an organic compound of manganese, and forming a barrier layer made of a compound of manganese for preventing diffusion of copper to the interlayer insulating film, such that the barrier layer covers an exposed surface of the interlayer insulating film;

after the formation of the barrier layer, supplying organic acid to the barrier layer in order to increase a ratio of manganese in the compound of manganese forming the barrier layer;

after the supply of the organic acid, forming the upper conductive channel mainly made of copper in the recess;

after the formation of the upper conductive channel, heating the substrate in order to separate out manganese from on the surface of the barrier layer or from in the barrier layer onto a surface of the upper conductive channel layer; and after the heating of the substrate, removing the manganese separated out on the surface of the upper conductive channel.

4. The method of manufacturing a semiconductor device according to claim 3, further comprising after the removal of the manganese separated out on the upper conductive channel, reacting a steam of an organic compound of manganese and a gas containing oxygen for forming an oxide of manganese with each other, and forming a barrier layer made of the oxide of manganese on the upper conductive channel.

5. The method of manufacturing a semiconductor device according to claim 1, further comprising before the formation of the barrier layer, removing an oxide of copper on the surface of the lower conductive channel, the surface being exposed to a bottom part of the recess.

6. The method of manufacturing a semiconductor device according to claim 5, wherein the removal of the oxide is to supply organic acid to the recess.

7. The method of manufacturing a semiconductor device according to claim 1, wherein the organic acid is carboxylic acid.

8. The method of manufacturing a semiconductor device according to claim 1, wherein the compound of manganese is an oxide of manganese.

9. A semiconductor manufacturing apparatus configured to form an upper conductive channel in a recess formed in an interlayer insulating film on a substrate surface, with a lower conductive channel mainly made of copper being exposed to a bottom part of the recess, the semiconductor manufacturing apparatus comprising:

a vacuum transfer chamber module including a vacuum-atmosphere transfer chamber into which a substrate is loaded, and a substrate transfer unit disposed in the transfer chamber;

a barrier-layer forming module including: a processing vessel in which a substrate can be placed, the processing vessel being hermetically connected to the vacuum transfer chamber module; and a unit configured to supply a gas containing an organic compound of manganese, and to form a barrier layer made of a compound of manganese for preventing diffusion of copper to the interlayer insulating film, such that the barrier layer covers an exposed surface of the interlayer insulating film;

an organic-acid supplying module including: a processing vessel in which a substrate can be placed, the processing vessel being hermetically connected to the vacuum transfer chamber module; and a unit configured to supply organic acid to the barrier layer in order to increase a ratio of manganese in the compound of manganese forming the barrier layer;

a seed-layer forming module including: a processing vessel in which a substrate can be placed, the processing vessel being hermetically connected to the vacuum transfer chamber module; and a unit configured to form a seed layer mainly made of copper on a surface of the barrier layer;

a heating module including: a processing vessel in which a substrate can be placed, the processing vessel being hermetically connected to the vacuum transfer chamber module; and a unit configured to heat the substrate in order to separate out manganese from on the surface of the barrier layer or from in the barrier layer onto a surface of the seed layer;

a cleaning-liquid supplying module including: a processing vessel in which a substrate can be placed, the processing vessel being hermetically connected to the vacuum transfer chamber module; and a unit configured to supply a cleaning liquid to the seed layer in order to remove the manganese separated out on the surface of the seed layer by the heating; and a conductive-channel forming module including: a processing vessel in which a substrate can be placed, the processing vessel being hermetically connected to the vacuum transfer chamber module; and a unit configured to form the upper conductive channel mainly made of copper in the recess;

wherein there is provided a control unit configured to control the substrate transfer unit such that a substrate loaded into the vacuum transfer chamber module is transferred to the barrier-layer forming module, the organic-acid supplying module, the seed-layer forming module, the heating module, the cleaning-liquid supplying module, and the conductive-channel forming module in this order.

10. A semiconductor manufacturing apparatus configured to form an upper conductive channel in a recess formed in an interlayer insulating film on a substrate surface, with a lower conductive channel mainly made of copper being exposed to a bottom part of the recess, the semiconductor manufacturing apparatus comprising:

a vacuum transfer chamber module including a vacuum atmosphere transfer chamber to which a substrate is loaded, and a substrate transfer unit disposed in the transfer chamber;

a barrier-layer forming module including: a processing vessel in which a substrate can be placed, the processing vessel being hermetically connected to the vacuum transfer chamber module; and a unit configured to supply a gas containing an organic compound of manganese, and to form a barrier layer made of a compound of manganese for preventing diffusion of copper to the interlayer insulating film, such that the barrier layer covers an exposed surface of the interlayer insulating film;

an organic-acid supplying module including: a processing vessel in which a substrate can be placed, the processing vessel being hermetically connected to the vacuum transfer chamber module; and a unit configured to supply organic acid to the barrier layer in order to increase a ratio of manganese in the compound of manganese forming the barrier layer;

a conductive-channel forming module including: a processing vessel in which a substrate can be placed, the processing vessel being hermetically connected to the vacuum transfer chamber module; and a unit configured to form the upper conductive channel mainly made of copper in the recess; and a heating module including: a processing vessel in which a substrate can be placed, the processing vessel being hermetically connected to the vacuum transfer chamber module; and a unit configured to heat the substrate in order to separate out manganese from on the surface of the barrier layer or from in the barrier layer onto a surface of the upper conductive channel;

wherein there is provided a control unit configured to control the substrate transfer unit such that a substrate loaded into the vacuum transfer chamber module is transferred to the barrier-layer forming module, the organic-acid supplying module, the conductive-channel forming module, and the heating module, in this order.

11. The semiconductor manufacturing apparatus according to claim 9, further comprising a copper-oxide removing module including: a processing vessel in which a substrate can be placed, the processing vessel being hermetically connected to the vacuum transfer chamber module; and a unit configured to remove an oxide of copper on the surface of the lower conductive channel, the surface being exposed to the bottom part of the recess, wherein the control unit is configured to control the substrate transfer unit such that the substrate loaded into the vacuum transfer chamber module is loaded into the copper-oxide removing module, and then transferred to the barrier-layer forming module.

12. The semiconductor manufacturing apparatus according to claim 11, wherein the unit configured to remove an oxide of copper is a unit configured to supply organic acid to the substrate.

13. The semiconductor manufacturing apparatus according to claim 9, wherein the organic acid is carboxylic acid.

14. The semiconductor manufacturing apparatus according to claim 9, wherein the compound of manganese is an oxide of manganese.

15. A non-transitory storage medium used in a semiconductor manufacturing apparatus configured to process a substrate, the storage medium storing a computer program operatable on a computer, wherein the computer program has a group of steps for realizing the method of manufacturing a semiconductor device according to claim 1.

* * * * *